United States Patent

[11] 3,588,635

[72] Inventor Albert H. Medwin
Whippany, N.J.
[21] Appl. No. 812,613
[22] Filed Apr. 2, 1969
[45] Patented June 28, 1971
[73] Assignee RCA Corporation

[54] INTEGRATED CIRCUIT
2 Claims, 3 Drawing Figs.

[52] U.S. Cl. .................... 317/235R, 317/235B, 317/235G, 307/304, 307/251
[51] Int. Cl. .................... H01l 11/00, H01c 7/14, H01l 19/00
[50] Field of Search .................... 317/235, 21.1, 22.2; 307/304; 330/38 (FE)

[56] References Cited
UNITED STATES PATENTS

| | | | |
|---|---|---|---|
| 3,392,341 | 7/1968 | Burns | 307/304 |
| 3,397,353 | 8/1968 | Hitt et al. | 330/38 |
| 3,456,169 | 7/1969 | Klein | 317/235 |

*Primary Examiner*—Jerry D. Craig
*Attorney*—Glenn H. Bruestle

ABSTRACT: In an integrated circuit including a complementary pair of insulated gate field effect transistors, each device has the same transconductance and means are provided to increase the gate to drain capacitance of the N-type device to match that of the P-type device. When the transistors are operated in parallel as a switch, they will pass a signal without distortion.

INVENTOR
ALBERT H. MEDWIN
BY Robert P. Williams
ATTORNEY

INTEGRATED CIRCUIT

BACKGROUND OF THE INVENTION

This invention relates to integrated circuits. More particularly, the invention relates to integrated circuits which employ insulated gate field effect transistors and in which both P channel and N channel devices are included.

It is known to connect enhancement-type insulated gate field effect transistors of mutually opposite-type conductivity in parallel for switching applications. A circuit to be controlled is connected in series with the transistors and a controlling circuit is connected to the gates of the transistors. To transmit a signal, enhancing voltages are applied to the gates of the two devices, whereby each device conducts. Capacitive feedthrough of the controlling signals tends to be cancelled. Even so, signals transmitted through the transistors have been distorted.

SUMMARY OF THE INVENTION

The present complementary insulated gate field effect transistor circuit device includes two transistors which are constructed so as to have equal transconductances. Means are provided to equalize their respective gate to drain capacitances.

THE DRAWINGS

THE PREFERRED EMBODIMENT

Figures 1, 2:
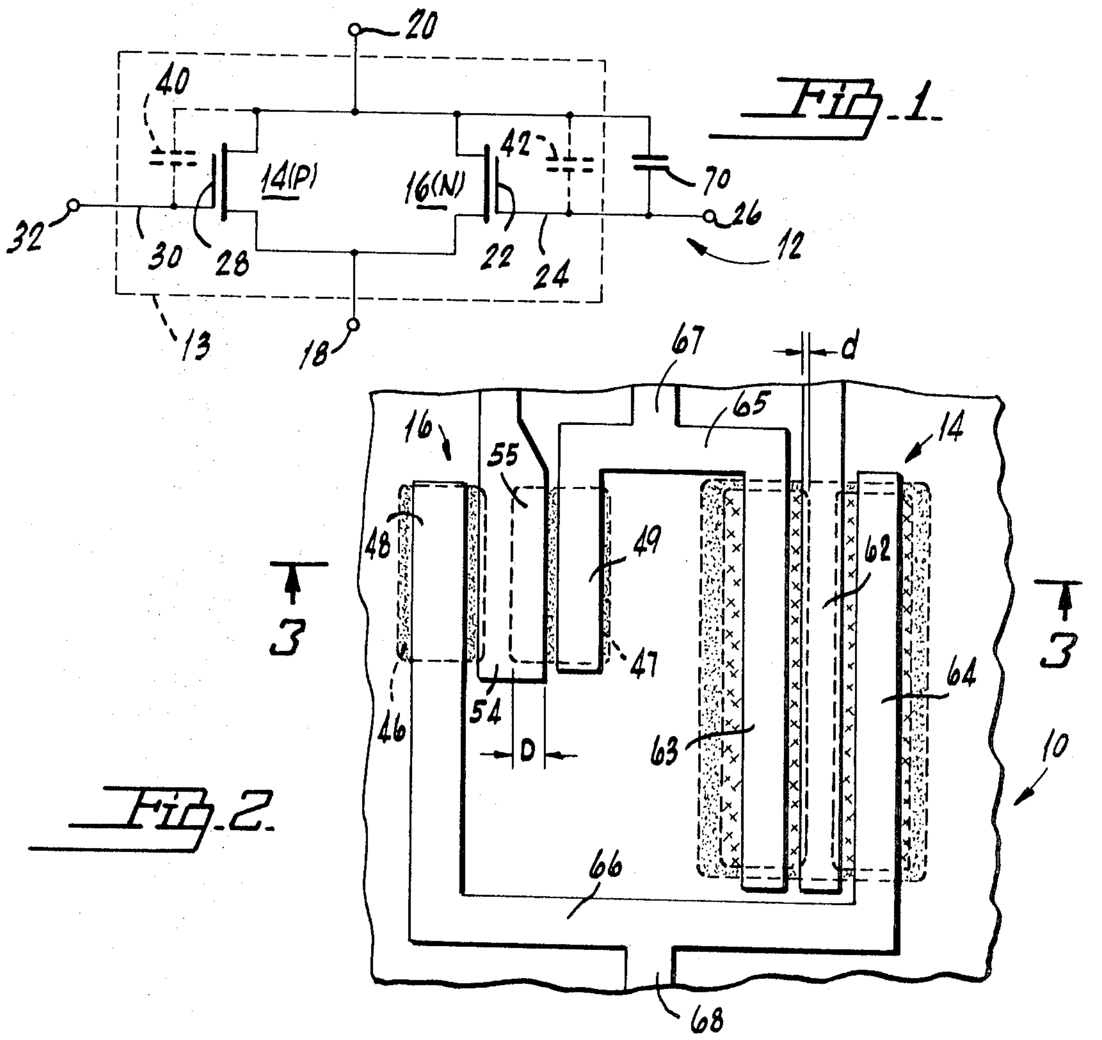
FIG. 1 is a schematic diagram of a novel switching circuit using complementary insulated gate field effect transistors.
FIG. 2 is a plan view of the present device.

The present device, indicated generally by the reference numeral 10 in FIG. 2, is particularly adapted for use in a switching circuit such as the circuit 12 shown in FIG. 1. Prior circuits have included the components shown within the dotted box 13 in FIG. 1, namely a P-type insulated gate field effect transistor 14 and an N-type field effect transistor 16 connected in parallel. The sources of the transistors 14 and 16 are connected together and to a terminal 18 and the drains of the transistors are connected together and to a terminal 20. A circuit to be controlled, not shown, is connected to the terminals 18 and 20.

The N-type transistor 16 has a gate 22 which is connected by means of a lead 24 to a terminal 26 adapted to be connected to a source of relatively high voltage above the threshold voltage of the transistor 16 and to a source of relatively low voltage below the threshold voltage of the transistor 16. The P-type transistor 14 has a gate 28 which is connected by means of a lead 30 to a terminal 32 adapted to be connected to sources of potential respectively above and below the threshold voltage of the transistor 14. In practice, gate voltages of equal magnitude but opposite polarity are applied simultaneously to the transistors 14 and 16 to turn them "on" or "off."

Each of the transistors 14 and 16 has an effective capacitance between its gate and its drain, as represented in the circuit 12 in phantom at 40 and 42. These capacitances couples the transients associated with the gating signals directly from the respective gates of the transistors to the output terminal 20. Where, as here, the gating signals are of opposite polarity, the capacitively coupled transients tend to be cancelled.

Prior circuits constructed in accordance with the arrangement with the dotted box 13 in FIG. I have not been fully satisfactory because the transmitted signal has been distorted in passing through the circuit.

Figure 3:
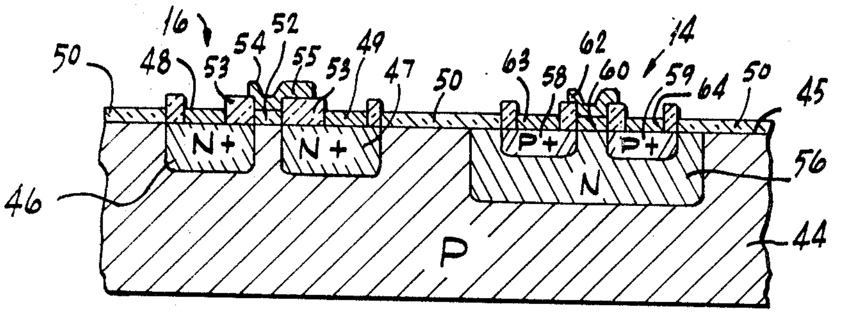
FIG. 3 is a cross section taken on the line 3–3 of FIG. 2.

The device 10 illustrated in FIGS. 2 and 3 provides a construction for the transistors 14 and 16 which is capable of transmitting a signal with substantially no distortion. The device 10 is shown in monolithic integrated circuit form although the principles of the invention may be applied to a conventional assembly of discrete transistors as well.

The device 10 is formed in a body 44 of monocrystalline semiconductive material such as silicon. The body 44 is largely of one type conductivity, for example, P-type. The transistor 16 appears at the left side of FIGS. 2 and 3 and includes a pair of spaced source and drain electrodes 46 and 47, respectively, which are diffused regions of N+-type conductivity in the body adjacent to the surface 45 thereof. Metal deposited layers 48 and 49 are in ohmic contact with the source and drain electrodes 46 and 47, respectively, and serve to couple these electrodes to other elements of the circuit.

The surface 45 of the body 44 is covered by a protective layer of insulation 50, which is typically of silicon dioxide thermally grown on the surface 45 of the body 44. The gate insulator of the transistor 16 may be a portion 52 of the insulating coating 50. In the regions adjacent to the source and drain electrodes 46 and 47, the insulation is thicker as indicated by the relatively thicker layers 53.

A gate electrode 54 is disposed on the gate insulator 52 and, because it is not practical to attempt to make the gate electrode coextensive with the gate insulator, the gate electrode 54 extends in overlapping relation to both the source electrode 46 and the drain electrode 47, respectively. In this embodiment, the gate electrode 54 has an extended portion 55 which extends over the drain electrode 47 to a substantial extent.

The transistor 14 is formed in an N-type well 56 in the body 44. There is a source electrode region 58 and a drain electrode region 59 in spaced relation defining a channel therebetween. In the space between the electrodes 58 and 59, there is a gate insulator 60, which may be a portion of the insulating coating 50. A gate electrode 62 overlies the insulator 60 and, as shown, extends in overlapping relation to the source and drain electrode regions 58 and 59. Contact metal layers 63 and 64 contact the source and drain electrode regions 58 and 59, respectively. The contact metal layer 63 is coupled to the contact metal layer 49 of the transistor 16 by a conductor 65 and the contact metal layer 64 is coupled to the contact metal layer 48 by a conductor 66 to connect the two transistors in parallel. Input and output conductors 67 and 68 are coupled to the conductors 65 and 66, respectively.

In order to transmit signals without distortion, the transconductance of the transistors 14 and 16 should be equal. The transconductance of an insulated gate field effect transistor is a function of the mobility of the charge carriers in the channel of the device, the gate-to-channel capacitance, the applied gate voltage, the channel length, as measured in the direction of current flow between the source and the drain, and the channel width, as measured transverse to the direction of current flow. Assuming that the drain voltage is greater than the gate voltage, $g_m$ is defined by the expression $$g_m = \frac{\mu_{(n \text{ or } p)} C_{go} V_g W}{L}$$

where (n or p) is the mobility of electrons or holes in the material of the device, $C_{gc}$ is the gate-to-channel capacitance, $V_g$ is the gate voltage, W is the width of the channel, and L is the length of the channel.

Electrons are more mobile than holes in conventional semiconductor materials such as silicon. In silicon, for example, $\mu_n$ is 1,350 cm.$^2$/V sec. and $\mu_p$ is 480 cm.$^2$/V sec. Consequently, where the semiconductor is silicon, the channel of a P-type transistor must be made about three times wider or one-third as long as that of an N-type transistor to achieve equal $g_m$ in the two devices. Because the length of the channel is usually made as small as possible for fast operation, the width rather than the length should be varied to adjust $g_m$.

As shown in FIG. 2, the width of the transistor 16, that is, the length of the adjacent facing surfaces of the regions 46 and 47, is shown to be about one-third that of the transistor 14.

As stated above, in conventional manufacturing of insulated gate devices, it is not economically practical to make electrodes coextensive with the channels of the devices and consequently there is always some overlap between the gate electrode and the drain electrode of the device. Usually this overlap is kept as small as possible, and there is a minimum practical overlap distance "*d*," as shown for the transistor 14 of FIG. 2. This overlap contributes greatly to the gate-to-drain capacitance of the device.

In order to cancel the capacitively coupled transients in the input signals, the effective gate-to-drain capacitance of the transistor 16 should be equal to that of the transistor 14. Equally is preferably achieved in the present device by providing the extended region 55 on the gate electrode 54 of the transistor 16. Thus, the gate electrode of the transistor 16 extends in overlapping relation to the source electrode 47 thereof to a greater extent "D" than the overlap distance "*d*" in the transistor 14. The amount of overlap distance "D" is that amount which will compensate for the longer width in the transistor 14. Alternatively, a separate capacitor 70 (FIG. 1) may be connected between the gate electrode and the drain electrode of the transistor 16.

I claim:

1. An electrical circuit comprising:

a first insulated gate field effect transistor comprising a source electrode, a drain electrode, a gate electrode and a P-type channel having a predetermined width and a predetermined length whereby said first insulated gate field effect transistor has a predetermined transconductance and a predetermined capacitance between its gate electrode and its drain electrode, and a second insulated gate field effect transistor electrically coupled to said first insulated gate field effect transistor, said second insulated gate field effect transistor having a source electrode connected to the source electrode of said first insulated gate field effect transistor, a drain electrode connected to the drain electrode of said first insulated gate field effect transistor, a gate electrode, an N-type channel having a width proportionately less than that of said first insulated gate field effect transistor whereby said second insulated gate field effect transistor has a transconductance substantially equal to that of said first insulated gate field effect transistor, and means for equalizing the gate to drain capacitance of said second insulated gate field effect transistor to that of said first insulated gate field effect transistor, said means comprising an extended portion of said gate electrode of said second insulated gate field effect transistor in overlapping relation to the drain electrode thereof.

2. An integrated circuit comprising:

a body of semiconductive material having a surface, means defining a P-type insulated gate field effect transistor in said body adjacent to said surface, said means comprising spaced source and drain electrode regions in said body adjacent to said surface, said regions defining a conductive channel of predetermined length and predetermined width, a layer of insulating material on said surface of said channel and a gate electrode on said insulating material, said gate electrode overlapping said drain electrode region to a predetermined extent, and means defining an N-type insulated gate field effect transistor in said body adjacent to said surface, said means comprising spaced source and drain electrode regions defining a conductive channel of the same predetermined length as said P-type insulated gate field effect transistor and of predetermined width proportionately less than that of said P-type insulated gate field effect transistor, a layer of insulating material on said surface over said channel and a gate electrode on said insulating layer, said gate electrode overlapping said drain electrode region to a greater extent than the overlap between the gate electrode and the drain electrode in said P-type insulated gate field effect transistor.

UNITED STATES PATENT OFFICE
CERTIFICATE OF CORRECTION

Patent No. 3,588,635 Dated June 28, 1971

Inventor(s) Albert H. Medwin

It is certified that error appears in the above-identified patent and that said Letters Patent are hereby corrected as shown below:

In the title: "Integrated Circuit" should be -- C/MOS Integrated Circuit Device --

Column 2, line 55: insert $\mu$ before (n or p)

Column 3, line 8: "Equally" should be -- Equality --

Signed and sealed this 28th day of December 1971.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
U.S. GOVERNMENT PRINTING OFFICE : 1969 O—366-334